US008685802B2

(12) United States Patent
Kelber et al.

(10) Patent No.: US 8,685,802 B2
(45) Date of Patent: Apr. 1, 2014

(54) GRAPHENE FORMATION ON DIELECTRICS AND ELECTRONIC DEVICES FORMED THEREFROM

(75) Inventors: Jeffry A. Kelber, Plano, TX (US); Sneha Sen Gaddam, Denton, TX (US); Cameron L. Bjelkevig, Rio Rancho, NM (US)

(73) Assignee: University of North Texas, Denton, TX (US)

( * ) Notice: Subject to any disclaimer, the term of this patent is extended or adjusted under 35 U.S.C. 154(b) by 611 days.

(21) Appl. No.: 12/980,763

(22) Filed: Dec. 29, 2010

(65) Prior Publication Data
US 2012/0168721 A1 Jul. 5, 2012

(51) Int. Cl.
*H01L 29/66* (2006.01)
*H01L 21/04* (2006.01)

(52) U.S. Cl.
USPC ............................. 438/149; 438/479; 438/571

(58) Field of Classification Search
USPC ........... 438/149, 479–480, 517; 257/E21.041
See application file for complete search history.

(56) References Cited

U.S. PATENT DOCUMENTS

| 7,960,259 B2 * | 6/2011 | Schultz et al. ................. 438/479 |
| 2013/0217222 A1 * | 8/2013 | Johnson et al. ................ 438/610 |

OTHER PUBLICATIONS

Bjelkevig, C. et al., "Electronic structure of a grapheme/hexagonal-BN heterostructure grown on Ru(0001) by chemical vapor deposition and atomic layer deposition: extrinsically doped graphene," J. Phys.: Condens. Matter, 2010, vol. 22, 302002, pp. 1-6.
Kong, L. et al., "Graphene/Substrate Charge Transfer Characterized by Inverse Photoelectron Spectroscopy," J. Phys. Chem. C, 2010, vol. 114, 21618-21624.
Mohapatra, C. and Eckstein, J., "Abstract: W26.00012: Growing Epitaxial Graphene on an Insulator by MBE," Mar. 19, 2009, http://meetings.aps.org/link/BAPS.2009.MAR.W26.12.
Rummeli, M. et al., "Direct Low-Temperature Nanographene CVD Synthesis over a Dielectric Insulator," American Chemical Society NANO, 2010, vol. 4, No. 7. pp. 4206-4210.
Moreau, E. et al., "Graphene growth by molecular beam epitaxy using a solid carbon source," Phys.Status Solidi, 2010, vol. 207, No. 2, pp. 300-303.
Park, J. et al., "Epitaxial Graphene Growth by Carbon Molecular Beam Epitaxy (CMBE)" Advanced Materials, 2010, vol. 22, pp. 4140-4145.

* cited by examiner

*Primary Examiner* — Cuong Q Nguyen
(74) *Attorney, Agent, or Firm* — Alchemy-Partners P.C.

(57) ABSTRACT

Methods of forming a graphene-based device are provided. According to an embodiment, a graphene-based device can be formed by subjecting a substrate having a dielectric formed thereon to a chemical vapor deposition (CVD) process using a cracked hydrocarbon or a physical vapor deposition (PVD) process using a graphite source; and performing an annealing process. The annealing process can be performed to temperatures of 1000 K or more. The cracked hydrocarbon of the CVD process can be cracked ethylene. In accordance with one embodiment, the application of the cracked ethylene to a MgO(111) surface followed by an annealing under ultra high vacuum conditions can result in a structure on the MgO(111) surface of an ordered graphene film with an oxidized carbon-containing interfacial layer therebetween. In another embodiment, the PVD process can be used to form single or multiple monolayers of graphene.

14 Claims, 6 Drawing Sheets

GRAPHENE FORMATION ON DIELECTRICS AND ELECTRONIC DEVICES FORMED THEREFROM

BACKGROUND OF THE INVENTION

Next wave micro- and nanoelectronic devices are looking towards new materials capable of keeping up with Moore's law trends, while still allowing for integration with high-throughput fabrication processes.

One material of interest for future devices is graphene. Graphene is a single atomic layer of graphite that shows promising electronic properties, including high mobility, high saturation velocity, stable crystal structure, and ultrathin layer thickness. To be utilized in electronic and device applications, graphene must rest on an electronically semiconducting or insulating substrate.

Current methods of producing graphene involve either growing graphene on a transition metal substrate and then transferring a single graphene sheet onto an insulating substrate, or growing graphene by thermal evaporation of silicon from bulk SiC(0001) substrates.

However, in order to provide a direct route towards the formation of graphene-based field effect transistors and other devices fabricated with high-throughput, scalable methods are needed for producing graphene directly on insulating materials, including those insulating materials that are integrable with silicon.

Accordingly, there continues to be a need in the art for materials and techniques capable of achieving graphene-based devices.

BRIEF SUMMARY

Methods are provided for forming graphene films directly on dielectrics. In accordance with an embodiment of the invention, a free-radical assisted chemical vapor deposition process is used to form ordered graphene films directly on a dielectric formed on a wafer. In accordance with another embodiment of the invention, a physical vapor deposition process is used to form graphene films on a dielectric on a wafer. Embodiments of the subject process are compatible with semiconductor processing and can be used to fabricate graphene-based logic devices.

According to one embodiment, an ordered graphene surface on an oxidized carbon-containing interfacial layer can be formed on MgO(111) surfaces by performing chemical vapor deposition using cracked ethylene followed by an annealing process to a temperature of about 1000 K or higher.

According to another embodiment, an ordered graphene surface on an oxidized carbon-containing interfacial layer can be formed on MgO(111) surfaces by performing physical vapor deposition (e.g., sputtering) of carbon onto an interfacial monolayer of carbon on a MgO(111) surface. Subsequently, an annealing process to a temperature of about 1000 K or higher can be performed. The oxidized carbon-containing interfacial layer may be formed by performing chemical vapor deposition using cracked ethylene. The physical vapor deposition process can be used to provide multiple monolayers of graphene on the substrate.

Advantageously, such structures exhibit a band gap while containing both the valence band and conduction band features characteristic of graphene.

BRIEF DESCRIPTION OF THE DRAWINGS

FIG. 5A shows a clean MgO(111) 3-fold LEED pattern and FIG. 5B shows a 6-spot image indicating graphene formation after performing an embodiment of the subject method.

FIG. 8A shows a XPS C(1s) spectrum of a multilayer adventitious carbon observed immediately after insertion of the MgO crystal into UHV at room temperature (no LEED pattern is observed); FIG. 8B shows a XPS C(1s) spectrum after annealing at 700 K in UHV in the presence of $O_2$ (XPS-derived average carbon layer thickness is 1 monolayer); FIG. 8C shows the corresponding LEED pattern for the substrate after annealing at 700 K in UHV in the presence of $O_2$, which exhibits $C_{3V}$ symmetry; FIG. 8D shows XPS after anneal of the film shown in FIGS. 8B and 8C to 1000 K in the presence of $C_2H_4$ ($5\times10^{-7}$ Torr, 25 min) (XPS-derived C thickness remains 1 monolayer); FIG. 8E shows the corresponding complex LEED pattern for the substrate after the anneal; and FIG. 8F shows a close-up of the pattern in FIG. 8E with integrated, background-subtracted intensities (arbitrary units) for "A" and "B" spots (circled). The A spots have an average intensity of 18.7±3, while the B spots have an average intensity of 12.9±1. Uncertainties are the standard deviations. Other spots in the image are weaker and are attributed to multiple diffraction. All LEED patterns were acquired at 80 eV beam energy. XPS spectra binding energies are referenced to a MgO lattice oxygen O(1s) binding energy of 530 eV.

DETAILED DISCLOSURE

Embodiments of the present invention provide methods of producing graphene directly on a dielectric layer and devices formed therefrom. In accordance with an embodiment of the invention, a free-radical assisted chemical vapor deposition (FRA-CVD) process is used to form highly ordered graphene films capable of being used in logic device applications. According to a specific embodiment, a chemical vapor deposition (CVD) process using cracked ethylene ($C_2H_4$) followed by an annealing process is performed to form ordered graphene films on a high-k oxide. In another embodiment a physical vapor deposition (PVD) process is performed to form one or more monolayers of graphene on the high-k oxide. Although MgO(111) is particularly exemplified herein, $Al_2O_3$(0001) and $SrTiO_3$(111) (or other perovskites or titanates), which exhibit similar surface properties (e.g., terminations) to that of MgO may also be used as the base dielectric. Also, other oxides with NaCl structure, including other alkali earths and NiO, can be used.

Figure 1A:
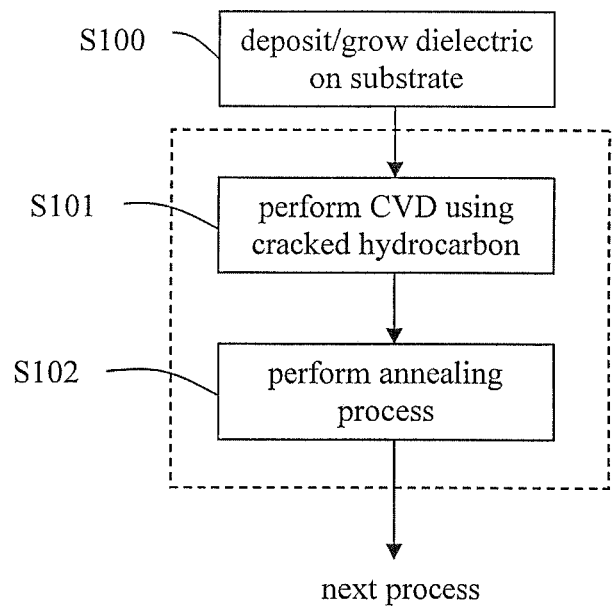
FIG. 1A is a block diagram of a method of directly forming graphene on a dielectric in accordance with an embodiment of the invention using free radical assisted chemical vapor deposition (FRA-CVD).

For example, referring to FIG. 1A, in a manufacturing process of an electronic device, after forming a high-k dielectric on a substrate (S100), an embodiment of the subject FRA-CVD process can be performed to form graphene directly on the dielectric. According to one embodiment, the FRA-CVD process involves performing CVD using a cracked hydrocarbon with respect to onto the substrate having the dielectric (S101), and then performing an annealing process (S102). In accordance with embodiments of the invention, the annealing is performed at temperatures of 1000 K or higher. The annealing process can be performed under ultra-high vacuum (UHV) (pressure of ~$10^{-9}$ Torr or less). According to another embodiment, the annealing may be performed in the presence of ethylene.

In one embodiment, the cracked hydrocarbon is ethylene. Of course, other embodiments can utilize other molecular or thermally dissociated precursors. The CVD process using the cracked ethylene can be performed at temperatures ranging from room temperature to about 700 K or higher. In certain embodiments, the CVD process is performed at a temperature of 500 K or higher. In other embodiments, the CVD process is performed at room temperature. According to certain embodiments, CVD via, for example, a thermal cracker can be used for forming monolayer graphene films. The thermal cracker can provide dissociated $C_2H_4$ molecules for CVD of the graphene film. The thermal cracker breaks the carbon-carbon bonds of certain organic molecules or hydrocarbons into simpler or shorter chains of hydrocarbons. The thermal cracker may also be used to provide atomic oxygen for cleaning the substrate.

Figure 1B:
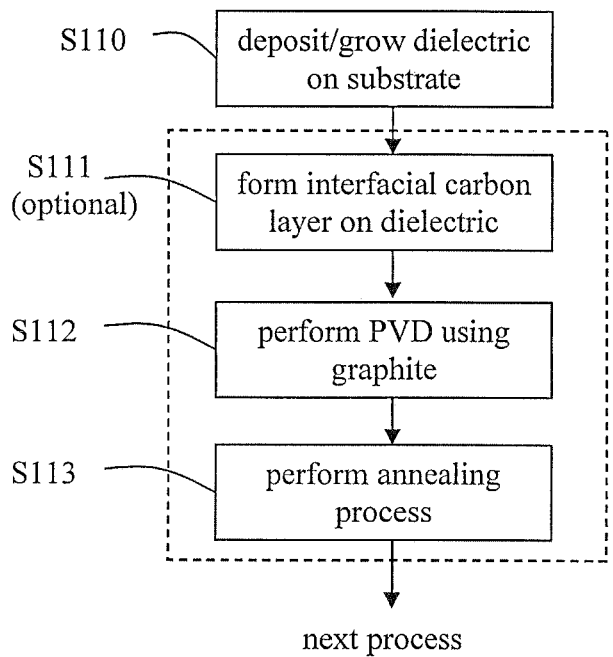
FIG. 1B is a block diagram of a method of directly forming graphene on a dielectric in accordance with an embodiment of the invention using physical vapor deposition (PVD).

PVD can be used for forming monolayer or multilayer films, such as described with respect to FIG. 1B. Referring to FIG. 1B, in a manufacturing process of an electronic device, after forming a high-k dielectric on a substrate (S110), a monolayer or multilayer of graphene can be formed on the high-k dielectric. In one embodiment, an interfacial layer of carbon is formed on the dielectric (S111). This optional interfacial layer of carbon can include adventitious carbon and may be formed via CVD using cracked or uncracked ethylene. According to an embodiment, one or more layers or partial layers of graphene can then be formed by performing PVD using graphite (S112), followed by performing an annealing process to temperatures of at least about 1000 K (S113). The PVD can be a sputtering method using a graphite sputtering target. The sputtering method can be performed in Ar plasma. In another embodiment, the PVD can be ebeam stimulated deposition from a graphite source, such as a carbon rod. In addition, the temperature conditions for the PVD can range from room temperature to higher temperatures. The annealing can be performed under UHV or in the presence of ethylene.

In accordance with certain embodiments of the invention, graphene can be formed on a dielectric by depositing carbon on the dielectric at temperatures of less than 1000 K, less than 900 K, less than 800 K, less than 700 K, in the range of 300 K-700 K, or even at or below room temperature by performing FRA-CVD or PVD; and then performing an annealing process to temperatures of at least 1000 K in UHV or in the presence of ethylene.

In accordance with another embodiment of the invention, the depositing of carbon and annealing can be performed at a same step by performing a CVD or PVD process at temperatures of 1000 K or higher.

Figure 2:
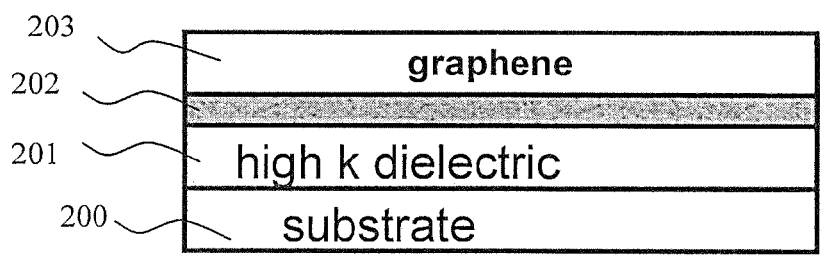
FIG. 2 shows a cross-sectional view of a structure formed in accordance with an embodiment of the invention.

Referring to FIG. 2, by performing the subject FRA-CVD process and/or PVD process as described with respect to FIGS. 1A and 1B, graphene 203 can be formed on a high-k dielectric 201 on a substrate 200. The substrate can be a silicon substrate (e.g., Si(100)). In addition to the formation of graphene 203, an interfacial layer 202 may be formed at the interface of the graphene 203 and the dielectric 201. The interfacial layer 202 can be formed via an active process step or as a result or by-product of the graphene formation process.

One oxide of interest for growing graphene is MgO, a high k oxide (k~10) that is integrable with Si(100). Advantageously, MgO can be formed on silicon using physical layer deposition (PLD) or chemical vapor deposition (CVD) methods, enabling integration with silicon fabrication processes. Other oxides of interest are aluminum oxide $Al_2O_3$ (sapphire) and $SrTiO_3$ because of their similar surfaces with respect to MgO. Certain embodiments of the invention can be implemented for MgO, $Al_2O_3$, $SrTiO_3$ and other dielectrics.

Figure 3:
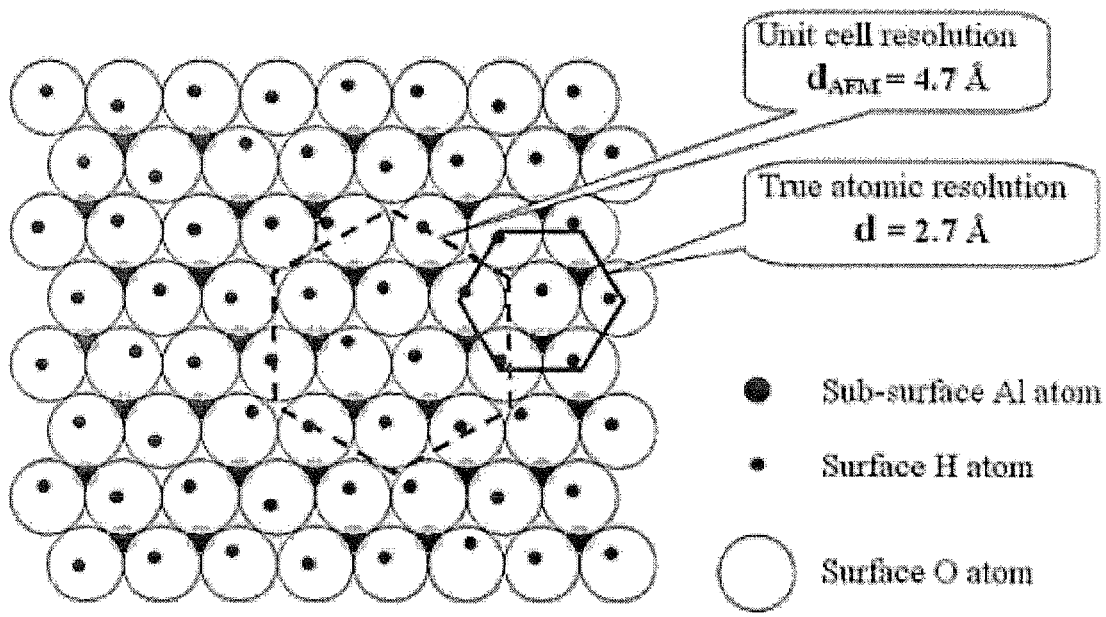
FIG. 3 shows a diagram illustrating the $Al_2O_3(0001)$ surface for explaining lattice matching.

For proper growth of graphene on a substrate, lattice matching can be important. The magnitude of the lattice vector for graphite (the (111) surface) is 2.46 Å. As shown in FIG. 3, the $Al_2O_3$ (0001) surface has a unit cell distance of $d_{AFM}$=4.7 Å, but an oxygen-oxygen nearest neighbor distance of d=2.7 Å. OH-terminated MgO(111) follows a similar structure, but $d_{AFM}$=4.2 Å and OH—OH nearest neighbor distance d=2.9 Å. In accordance with certain embodiments of the invention, even with an up to 20% lattice mismatch, graphene growth is possible.

In particular, for templating, the nearest neighbor distance of O or OH for the surface layer is relevant to the selection of the oxide, not the unit cell distance determined by first and second layer coordination. In addition, the thermal stability of the oxide to ~800° C. can be important for the ordering of the graphene layer on the oxide.

In accordance with embodiments of the present invention, ordered graphene growth can occur on top of an interfacial layer created during the formation of the graphene on the high k oxide by performing the subject method.

Furthermore, by producing graphene directly on insulating materials that are integrable with silicon, production and integration with current CMOS and other silicon processes can be facilitated.

For example, a logic device can be configured from the graphene grown by embodiments of the subject method due to the existence of a bandgap.

Moreover, by producing graphene directly on multifunctional oxides, such as those exhibiting ferroelectric behavior, graphene-based memory and other devices can be facilitated.

A greater understanding of the present invention and of its many advantages may be had from the following examples, given by way of illustration. The following examples are illustrative of some of the methods, applications, embodiments and variants of the present invention. They are, of course, not to be considered in any way limitative of the invention. Numerous changes and modifications can be made with respect to the invention.

Example FRA-CVD on MgO(111) Films

For forming highly ordered graphene films on MgO(111) surfaces, one embodiment of the FRA-CVD process involves the focusing of a flux of dissociated ethylene molecules onto a disordered but clean MgO(111) surface, followed by annealing in UHV to ~1000 K. The CVD process of the example embodiments were carried out at 700 K and 600 K without showing much variation between the two temperatures.

In accordance with an example embodiment, a disordered surface of MgO(111) on a wafer was exposed to cracked $C_2H_4$ at ~600 K ($5\times10^{-7}$ Torr, 25 min). The wafer was then removed to the ambient and re-inserted on a better sample holder. The wafer was then annealed in UHV to 1000 K.

Figure 4:
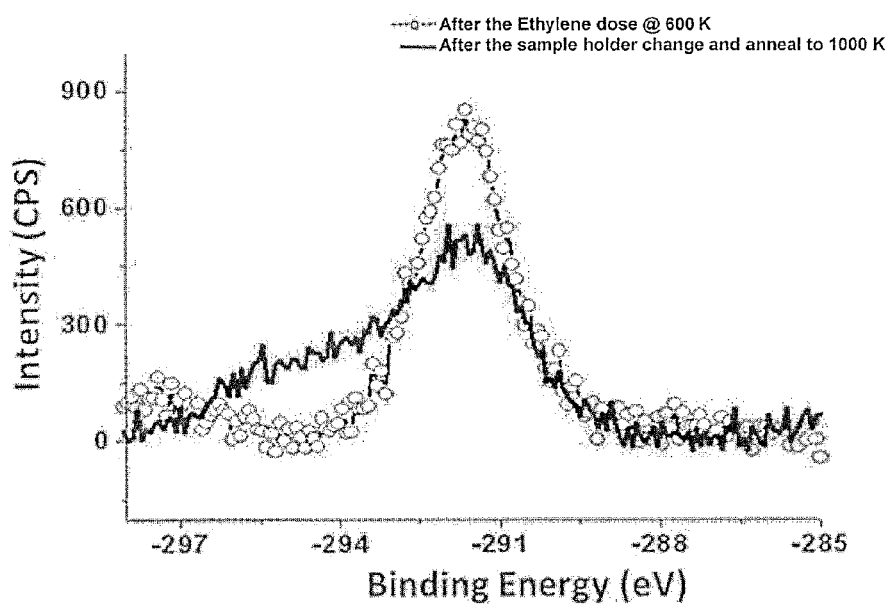
FIG. 4 shows an X-ray photoelectron spectroscopy (XPS) plot of a wafer fabricated in accordance with an embodiment of the invention after an ethylene dose at ~600 K and after a sample holder change and anneal to 1000 K.
Figure 5A:
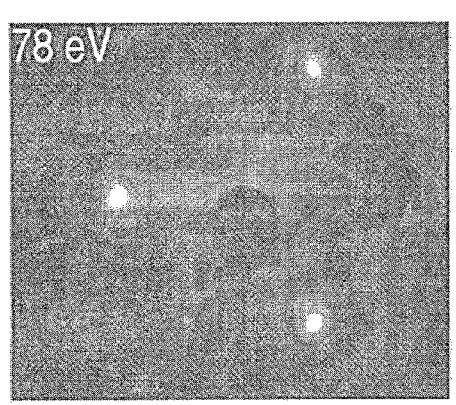
FIGS. 5A and 5B show low energy electron diffraction (LEED) pattern images.
Figure 5B:
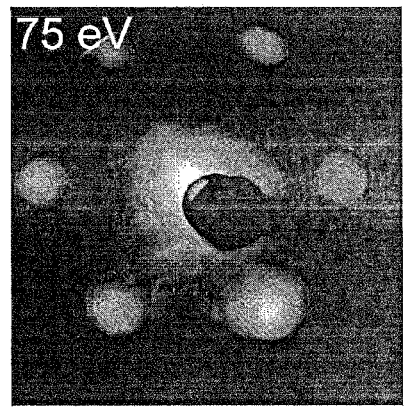

FIG. 4 shows a XPS plot of the wafer after the ethylene dose at ~600 K and after the sample holder change and anneal to 1000 K. The spectra were shifted to align peak maxima. As can be seen in the plot, an oxidized carbon interface occurs after the anneal is performed. In addition, a total average carbon thickness of 3 Å was determined after exposing the substrate to the dissociated ethylene, and the total average thickness of the carbon layer after annealing to 1000 K was 2.5 Å. indicating that exposure to the ambient and subsequent annealing in UHV did not result in significant increase in surface carbon. As shown in FIG. 4, the annealing process did result in a significant broadening of the C(1s) spectrum toward higher binding energy, indicating the presence of surface carbon in multiple oxidation states. FIGS. 5A and 5B provide LEED pattern images before and after performing the subject FRA-CVD process on a MgO(111) film. In particular, FIG. 5A shows a clean MgO(111) 3-fold LEED pattern and FIG. 5B shows a 6-spot image indicating graphene formation after the subject CVD process.

Figure 6:
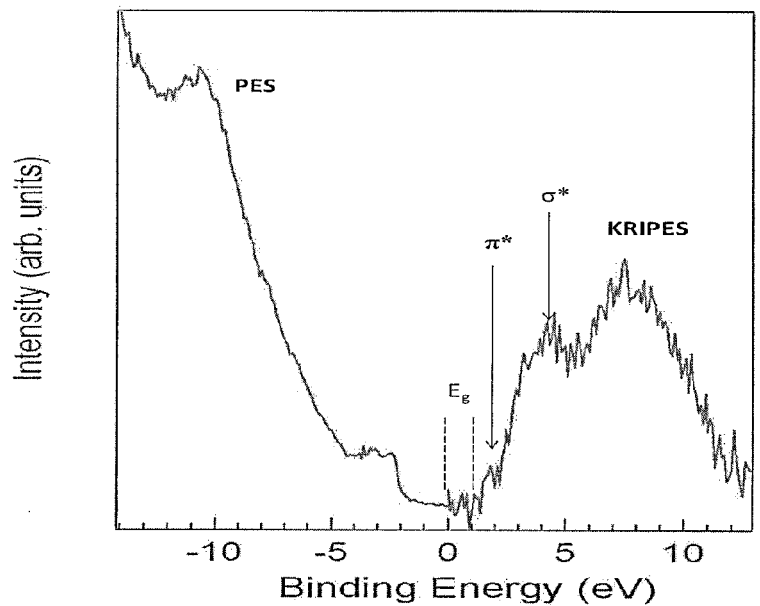
FIG. 6 shows a photoelectron spectroscopy (PES) and k vector-resolved inverse photoelectron spectroscopy (KRIPES) plot of a structure fabricated in accordance with an embodiment of the invention.

As shown in FIG. 6, PES and KRIPES indicate a band gap (~1 eV) for the FRA-CVD fabricated graphene structure. Indeed, embodiments of the subject method can achieve a band gap at room temperature of ~0.5 eV to 1 eV. The presence of this band gap indicates applicability for logic device applications. In particular, the band gap in the fabricated graphene structure allows for an "off state" where current is absent when an applied external electric field is absent.

Example PVD on MgO(111) Films

For forming highly ordered graphene films on MgO(111) surfaces, one embodiment of the PVD process involves growing a graphene layer by PVD on an interfacial carbon layer formed on MgO(111), followed by annealing in UHV to ~1000 K or higher. Another embodiment performs the annealing in the presence of ethylene. The interfacial carbon layer may be existing adventitious carbon on the surface, may be formed by CVD using cracked or uncracked ethylene or other precursor, or even may be formed by PVD. It should be understood that the separate step of forming the interfacial carbon layer as described in the example embodiments can be omitted.

In one example, single and multilayers of graphene were formed on MgO(111) by annealing an adventitious carbon layer in the presence of uncracked ethylene to form an interfacial carbon layer, and then forming graphene via PVD (by sputter deposition) of carbon at 300 K followed by annealing in UHV at 1000 K. LEED pattern images (not shown) indicated graphene on the oxide.

Figure 7:
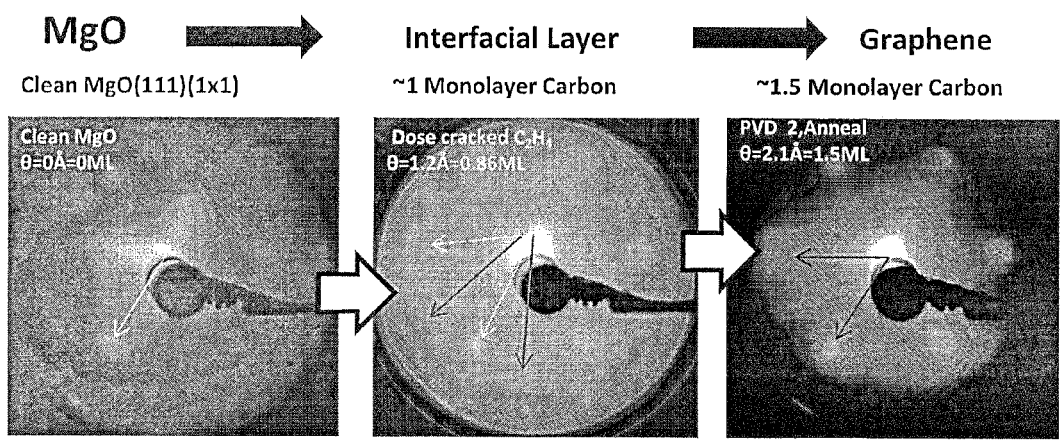
FIG. 7 shows a progression of ordered graphene single and multilayers on MgO(111) at stages of an embodiment of the subject method.

FIG. 7 shows a progression of ordered graphene single and multilayers on MgO(111) for another example embodiment. Referring to FIG. 7, initially, a clean MgO(111) film shows a 3-fold LEED pattern due to symmetry of MgO layers (ABAB). XPS indicated carbon coverage on the clean MgO film to be 0. After a dose of cracked $C_2H_2$, extra spots emerge in the LEED pattern (center image). The ~1 monolayer of carbon has broken the symmetry of the substrate. XPS indicated carbon coverage at this stage to be 1.2 Å thick, which is about 0.86 of a monolayer of graphene. Finally, after performing the PVD (by sputter deposition) and annealing process (in UHV to 1000 K), the 6-spot LEED pattern indicating graphene appears. XPS indicated carbon coverage thickness of 2.1 Å, corresponding to ~1.5 carbon monolayer.

In yet another embodiment example, an interfacial layer of a monolayer of adventitious carbon was used. The monolayer of adventitious carbon was created in certain examples by removing all but the monolayer of adventitious carbon from a "dirty" MgO film. This was accomplished by subjecting the dirty MgO film to a molecular (undissociated) oxygen anneal at 700 K. FIGS. 8A-8F show XPS and LEED spectra at stages of an embodiment of the invention having an interfacial layer of a monolayer of adventitious carbon. For the example embodiment shown in FIGS. 8A-8F, the annealing process is carried out in the presence of ethylene in accordance with an embodiment of the invention instead of under UHV.

Figure 8:
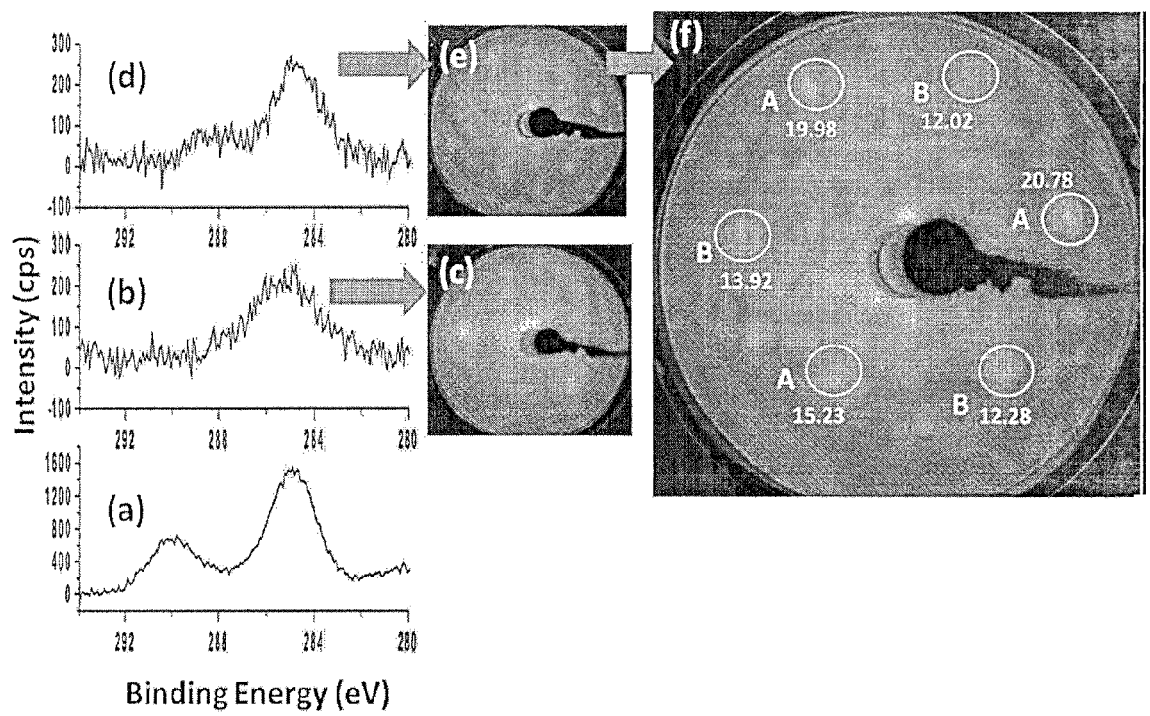
FIGS. 8A-8F show C(1s) XPS and LEED spectra for formation of an ordered carbon monolayer on MgO(111) in accordance with an embodiment of the invention.

Referring to FIGS. 8A-8F, XPS and LEED intensity analyses indicate that a hexagonally-ordered carbon monolayer (C(111)) on MgO(111) exhibits $C_{3v}$ symmetry, with alternating strong and weak intensities exhibited by diffraction spots in an apparently 6-fold LEED pattern (from two interwoven 3-fold patterns), similar to the case shown in FIG. 5B using FRA-CVD (but the A site/B site average intensity difference is less pronounced in FIG. 5B than for the single C(111) layer shown in FIGS. 8C, 8E, and 8F). This $C_{3v}$ LEED symmetry is also observed for a graphene layer grown by PVD on an interfacial carbon layer as shown in FIG. 7. Such A site/B site chemical inequivalence lifts the HOMO/LUMO (highest occupied molecular orbital/lowest unoccupied molecular orbital) degeneracy for the single layer graphene lattice at the Dirac point, thus opening a band gap.

The evolution of the ordered C(111) layer on MgO(111) is shown in FIGS. 8A-8F. As shown in FIG. 8A, a multilayer adventitious carbon film is observed upon insertion of the MgO(111) single crystal into UHV. Referring to FIG. 8B, extensive annealing in $O_2$ at 700 K, $5\times10^{-7}$ Torr removes all but ~1 ML as determined by XPS. The corresponding three-fold LEED pattern shown in FIG. 8C is representative of an OH-terminated MgO(111)(1×1) surface and indicates a disordered carbon overlayer that does not contribute to the LEED scattering. Referring to FIG. 8D, subsequent annealing to 1000 K in the presence of $5\times10^{-6}$ Torr of $C_2H_4$ yields a C(1s) spectrum with unchanged average thickness, but with a feature near 288 eV binding energy—indicative of carbon in a higher oxidation state. The corresponding LEED pattern shown in FIG. 8E displays apparent 6-fold symmetry. Referring to FIG. 8F, the intensity analysis of the LEED pattern of FIG. 8E indicates that this pattern actually consists of two $C_{3v}$ patterns. The A sites have an average, background-subtracted, intensity (arbitrary units) of 18.7±3, compared to a corresponding value of 12.9±1 for the B sites. (The uncertainties correspond to the standard deviations). These data indicate an experimentally significant difference in intensities on A and B sites, and thus demonstrate that the corresponding lattice sites in the real space graphene layer have different electron densities.

Figures 9A, 9B:
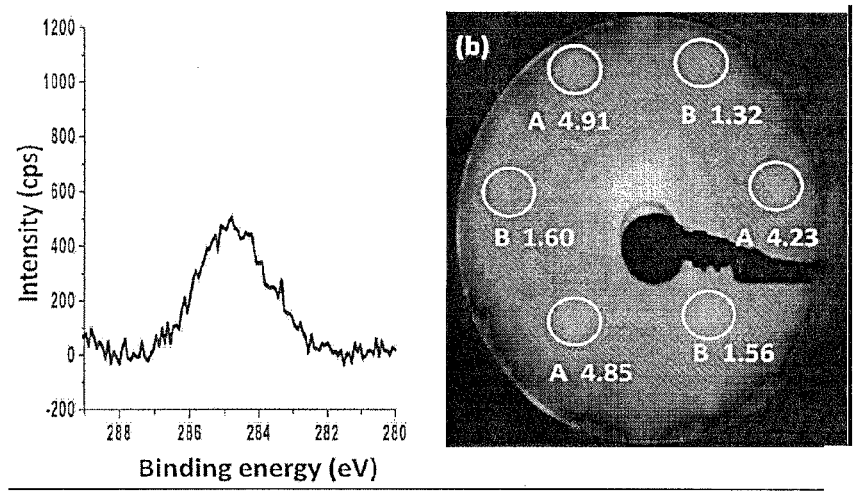
FIGS. 9A and 9B show C(1s) XPS and corresponding LEED pattern for graphene formed by PVD on an ordered carbon monolayer in accordance with an embodiment of the invention.

A similar pattern was observed for a partial graphene layer grown by exposing an ordered interfacial layer on MgO (similar to FIG. 8C) to PVD from a graphite sputter magnetron target in Ar plasma at ambient sample temperature. Subsequent annealing in UHV yielded the XPS and LEED data shown in FIGS. 9A and 9B, respectively. The A site average intensity is 4.7±0.4 and the average B site intensity is 1.5±0.2. The average carbon thickness, determined from XPS, is 1.5 ML.

Table 1 provides a summary of LEED "A" and "B" site diffraction spot intensities as a function of carbon overlayer average thickness determined by XPS.

TABLE I

| Average carbon thickness (ML) | Average A site LEED intensity (arb. units)* | Average B site LEED intensity (arb. units)*. | Remarks |
|---|---|---|---|
| 1.0 | 18.7 (±3) | 12.9 (±1) | Interfacial Layer |
| 1.5 | 4.7 (±0.4) | 1.5 (±0.2) | Interfacial Layer + PVD |
| 2.5 | 9.9 (±3) | 7.5 (±0.9) | Graphene-interfacial bilayers formed by FRA-CVD and annealing to 1000 K |

As summarized in Table I, the $C_{3V}$ symmetry is also observed for an intensity analysis for the 2.5 ML thick graphene/interfacial bilayer formed by FRA-CVD (as shown in FIG. 5B), although the disparity between A and B site intensities appears to decrease as the carbon layer average thickness increases. The formation of a band gap may occur due to the lifting of the chemical equivalence of A and B sites in the graphene lattice. In particular, the HOMO and LUMO orbitals for a single layer of graphene are degenerate if the A and B sites (adjacent carbon sites) in the graphene lattice are chemically identical. Removal of this A site/B site chemical equivalence, due to, e.g., substrate interactions leading to different charge densities on. A vs. B sites, would lift the HOMO/LUMO degeneracy, thus inducing a band gap. The LEED shown here demonstrate an experimentally significant difference in A and B site intensities, and therefore electron charge densities, for hexagonally-ordered carbon overlayers on MgO(111), but also suggest that this trend may decrease with the formation of additional graphene overlayers.

According to one embodiment, single or limited multilayer layer graphene can be formed on a dielectric via PVD. A recurring problem with CVD of 2-dimensional systems is that the formation of a complete layer often renders the surface relatively inert towards subsequent deposition. In contrast embodiments of the subject invention allow for fabrication of single/few layer graphene on oxide surfaces such as MgO (111) and NaCl structure-oxides Accordingly, direct graphene film growth on MgO(111) and other dielectrics is possible by free radical assisted CVD or by PVD, and that a band gap results directly from carbon/oxide interfacial interactions.

In accordance with certain embodiments of the invention, graphene layers can be formed by FRA-CVD or PVD on MgO(111) or other dielectrics.

In certain embodiments, multi-layer formation may be desirable, while in other embodiments, single layer graphene formation is desirable. Experiments conducted by the inventors show that increasing layers of graphene cause a reduction in bandgap. Further, band gap and mobilities can be tuned through the deposition of varying numbers of graphene layers. Accordingly, embodiments of the graphene/MgO/Si system can be adopted for practical FET device applications.

Figure 10:
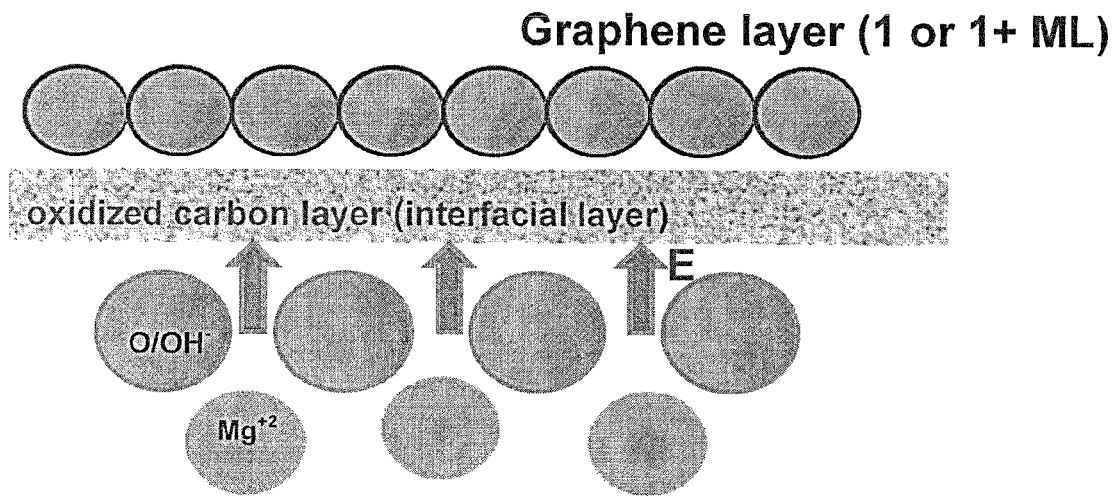
FIG. 10 shows a representational diagram of the oxide/interfacial layer/graphene structure.

The particular band gap achieved by the graphene formed in accordance with embodiments of the invention may be a result of symmetry breaking at the graphene layer/oxide interface and/or an applied external field (or dipolar electric field) from the oxidized carbon interfacial layer/oxide region that opens a gap. For example, referring to FIG. 10, an electric field E from the MgO/interfacial layer region may open a hand gap in the graphene.

Figure 11:
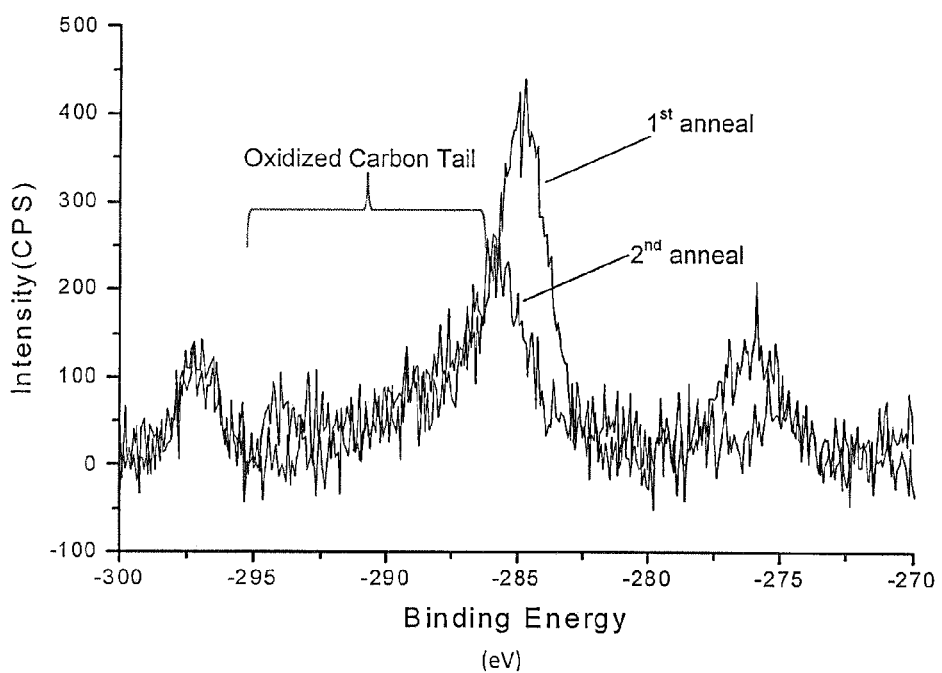
FIG. 11 shows and XPS plot of a wafer fabricated in accordance with an embodiment of the invention after performing annealing processes for adventitious carbon removal.

Verification of the existence of an interfacial oxidized carbon at the graphene/oxide interlace was performed. Adventitious Carbon (AC) can be removed by a molecular oxygen (undissociated) anneal at 700 K or by atomic oxygen at any temperature at or above room temperature. For the experiment example with results shown in FIG. 11, the AC was removed by atomic oxygen at room temperature. Accordingly, multiple anneals were performed to remove AC and verify the existence of interfacial oxidized carbon at the graphene/oxide interface. A XPS plot is shown in FIG. 11 (with binding energy calibration of 530 eV for O(1s)). As shown in FIG. 11, an "oxidized" carbon tail exists in the structure. Although this could be an artifact of the ambient exposure, the results shown in FIG. 11 illustrate that the tail occurs after annealing in oxygen. In particular, the wafer was exposed to atomic oxygen (in which $O_2$ is predissociated in a thermal or plasma source) under a pressure of $5 \times 10^{-7}$ Torr and a temperature of 300 K. The first anneal treatment resulted in an average C thickness of 3.6 Å, with greater than two monolayers present. The second anneal treatment resulted in an average C thickness of 1.8 Å and one graphene monolayer. Subsequent anneals resulted in no further change. The presence of the oxidized carbon tail after the multiple anneals indicates the presence of the oxidized carbon interfacial layer and its resistance to $O_2$ cleaning.

In certain embodiments, the atomic oxygen anneal can be used to clean the dielectric surface (removing adventitious carbon) before forming the graphene. In one embodiment, adventitious carbon can remain on the dielectric, and the PVD and annealing process can be performed to form graphene on the dielectric. Although the FRA-CVD embodiments described herein are preformed on cleaned dielectric surfaces (having the carbon removed), these should not be construed as limiting the FRA-CVD from being implemented on a dielectric having a layer of carbon.

Although not demonstrated in the example, graphene can be grown on disordered or amorphous surfaces using the subject free-radical assisted chemical vapor deposition process or physical vapor deposition process followed by annealing.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

What is claimed is:

1. A method of forming a graphene-based device, the method comprising: depositing carbon on a substrate having a dielectric formed thereon; and performing an annealing process with respect to the substrate having the carbon deposited thereon to form ordered graphene from the carbon on the dielectric.

2. The method according to claim 1, wherein the depositing of the carbon on the substrate is performed at a temperature in a range of 300 K-700 K, and wherein the performing the annealing process is performed at a temperature of at least 1000 K.

3. The method according to claim 1, wherein depositing carbon on the substrate having the dielectric formed thereon comprises: subjecting the substrate having the dielectric formed thereon to a chemical vapor deposition (CVD) process using a cracked hydrocarbon.

4. The method according to claim 3, wherein the cracked hydrocarbon is ethylene ($C_2H_4$).

5. The method according to claim 3, wherein subjecting the substrate having the dielectric formed thereon to the CVD process using the cracked hydrocarbon comprises: applying a flux of dissociated hydrocarbon molecules onto the dielectric of the substrate.

6. The method according to claim 3, wherein depositing carbon on the substrate having the dielectric formed thereon further comprises: performing physical vapor deposition using a graphite target or source to deposit additional layers of carbon on an interfacial carbon layer formed by the subjecting the substrate having the dielectric formed thereon to the CVD process using the cracked hydrocarbon.

7. The method according to claim 1, wherein depositing carbon on the substrate having the dielectric formed thereon comprises: performing physical vapor deposition using a graphite target or source to deposit the carbon.

8. The method according to claim 1, wherein the dielectric comprises a high-k oxide.

9. The method according to claim 1, wherein the dielectric is MgO.

10. The method according to claim 8, wherein the dielectric is MgO(111).

11. The method according to claim 1, wherein the substrate comprises silicon.

12. The method according to claim 1, wherein the dielectric is $Al_2O_3$.

13. The method according to claim 1, wherein performing the annealing process with respect to the substrate having the carbon deposited thereon to form ordered graphene from the carbon on the dielectric comprises performing the annealing under UHV conditions.

14. The method according to claim 1, wherein performing the annealing process with respect to the substrate having the carbon deposited thereon to form ordered graphene from the carbon on the dielectric comprises performing the annealing to a temperature of about 1000 K or higher.

* * * * *